(12) United States Patent
Kim et al.

(10) Patent No.: US 8,796,702 B2
(45) Date of Patent: Aug. 5, 2014

(54) ORGANIC LIGHT EMITTING DISPLAY DEVICE

(75) Inventors: Jung-Yeon Kim, Yongin (KR);
Mu-Hyun Kim, Yongin (KR);
Beom-Rak Choi, Yongin (KR);
Un-Cheol Sung, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 311 days.

(21) Appl. No.: 13/419,797

(22) Filed: Mar. 14, 2012

(65) Prior Publication Data

US 2012/0168783 A1    Jul. 5, 2012

Related U.S. Application Data

(62) Division of application No. 13/064,140, filed on Mar. 8, 2011, now Pat. No. 8,193,017.

(30) Foreign Application Priority Data

Mar. 15, 2010    (KR) .................. 10-2010-0022943

(51) Int. Cl.
*H01L 51/50*    (2006.01)

(52) U.S. Cl.
USPC .................... 257/88; 257/79; 257/89; 257/90

(58) Field of Classification Search
USPC .......................................... 257/79, 88, 89, 90
See application file for complete search history.

(56) References Cited

U.S. PATENT DOCUMENTS

2011/0012816 A1    1/2011    Kang et al.

FOREIGN PATENT DOCUMENTS

| JP | 2008-112112 A | 5/2008 |
| KR | 10-2004-0078304 A | 9/2004 |
| KR | 10-2006-0123945 A | 12/2006 |
| KR | 10-2010-0043943 A | 4/2010 |
| KR | 10-2011-0008621 A | 1/2011 |

OTHER PUBLICATIONS

Korean Office Action from KR 10-2010-0022943, dated May 30, 2011.
Korean Registration Determination Certificate in KR 10-2010-0022943, dated Dec. 30, 2011.

*Primary Examiner* — Long Pham
(74) *Attorney, Agent, or Firm* — Lee & Morse, P.C.

(57) ABSTRACT

An organic light emitting display device includes a substrate, a plurality of pixels on the substrate having a first region configured to emit light and a second region configured to transmit external light, a plurality of pixel circuit units, a plurality of first electrodes, a first organic layer on the plurality of first electrodes, a second organic layer on the first organic layer, the second organic layer including an emission layer, a third organic layer on the second organic layer, the third organic layer being positioned in the first region and outside a central portion of the second region, and a second electrode having a first portion only on the third organic layer.

12 Claims, 4 Drawing Sheets

ORGANIC LIGHT EMITTING DISPLAY DEVICE

CROSS REFERENCE TO RELATED APPLICATION

This is a divisional application based on pending application Ser. No. 13/064,140, filed Mar. 8, 2011, the entire contents of which is hereby incorporated by reference.

BACKGROUND

1. Field

Example embodiments relate to an organic light emitting display device and a method of manufacturing the same, and more particularly, to a transparent organic light emitting display device and a method of manufacturing the same.

2. Description of the Related Art

Applications of organic light emitting display devices range from personal portable devices, e.g., MP3 players and mobile phones, to television sets due to their superior characteristics, e.g., wide viewing angles, high contrast ratios, short response times, and low amounts of power consumption. For example, an organic light emitting display device may be formed to be a transparent display device by having transparent thin film transistors and transparent organic light emitting devices. However, since a cathode of the organic light emitting display device is formed of metal, transmittance of the transparent display device may be limited.

SUMMARY

Embodiments are therefore directed to an organic light emitting display device and a method of manufacturing the same, which substantially overcome one or more of the problems due to the limitations and disadvantages of the related art.

It is therefore a feature of an embodiment to provide a transparent organic light emitting display device having high external-light transmittance.

It is therefore another feature of an embodiment to provide a transparent organic light emitting display device with an improved, patterned structure of a cathode therein.

It is still another feature of an embodiment to provide a method of manufacturing a transparent organic light emitting display with one or more of the above features.

At least one of the above and other features and advantages may be realized by providing an organic light emitting display device, including a substrate, a plurality of pixels on the substrate, each pixel having a first region configured to emit light and a second region configured to transmit external light, a plurality of pixel circuit units, each pixel circuit unit being in the first region of each of the plurality of pixels and including at least one thin film transistor, a plurality of first electrodes, each first electrode being in the first region of each of the plurality of pixels and being electrically connected to a respective pixel circuit unit, the first electrode having an island shape corresponding to a respective pixel of the plurality of pixels, a first organic layer covering the plurality of first electrodes, a second organic layer on the first organic layer, the second organic layer including an emission layer, a third organic layer on the second organic layer, the third organic layer being positioned in the first region and outside a central portion of the second region, and a second electrode having a first portion only on the third organic layer.

The first organic layer may include at least one of a hole transport layer (HTL) and a hole injection layer (HIL).

The third organic layer may include at least one of an electron transport layer and an electron injection layer.

The third organic layer may be only in the first region, the second electrode being only and directly on the third organic layer.

The first organic layer may be only in the first region, the third organic layer completely overlapping the first organic layer.

The first organic layer may be formed on both of the first region and the second region, the first organic layer extending beyond the third organic layer.

The second electrode may further include a second portion on the first organic layer in the second region, the first and second portions of the second electrode being connected to each other.

A thickness of the second portion may be smaller than a thickness of the first portion.

The plurality of pixel circuit units may overlap the plurality of first electrodes, respectively.

The first region of the each of the plurality of pixels may include a light emission region and a circuit region, each of the plurality of pixel circuit units being formed in the circuit region, and each of the plurality of first electrodes being formed in the light emission region.

The light emission region and the circuit region of the each of the plurality of pixels may be arranged to be adjacent to each other.

The organic light emitting display device may further include an insulating layer covering ends of each of the plurality of first electrodes, the third organic layer separating the second electrode from the insulating layer.

The second electrode may include magnesium (Mg).

At least one of the above and other features and advantages may also be realized by providing a method of manufacturing an organic light emitting display device, including defining a plurality of pixels on a substrate, each pixel having a first region configured to emit light and a second region configured to transmit external light, forming a plurality of pixel circuit units, such that each of the plurality of pixel circuit units is arranged in the first region of each of the plurality of pixels and includes at least one thin film transistor, forming a plurality of first electrodes, such that each of the plurality of first electrodes is arranged in the first region of each of the plurality of pixels and is electrically connected to a respective pixel circuit unit, the first electrodes being patterned to have an island shape that is separate in each of the plurality of pixels, forming a first organic layer patterned to cover the plurality of first electrodes, forming a second organic layer on the first organic layer, such that the second organic layer includes an emission layer and is patterned to correspond to each of the plurality of first electrodes, forming a third organic layer on the second organic layer, such that the third organic layer is patterned to be in the first region and outside a central portion of the second region, and depositing metal on the third organic layer to form a second electrode on the third organic layer, such that the second electrode includes a first portion only on the third organic layer.

Depositing the metal may include depositing magnesium (Mg) on the third organic layer.

Forming the second electrode may include depositing the metal only on the third organic layer in the first region.

The first organic layer may include at least one of a hole transport layer (HTL) and a hole injection layer (HIL).

The third organic layer may include at least one of an electron transport layer and an electron injection layer.

The first organic layer may be patterned not to be formed on a portion of the second region.

The first organic layer may be formed on both of the first region and the second region.

The second electrode may be positioned on a portion of the second region where the third organic layer is not formed, and may further include a second portion connected to the first portion.

A thickness of the second portion may be less than a thickness of the first portion.

The plurality of pixel circuit units may be overlapped on the plurality of first electrodes, respectively.

The first region of the each of the plurality of pixels may include a light emission region and a circuit region, wherein each of the plurality of pixel circuit units is formed in the circuit region, and each of the plurality of first electrodes is formed in the light emission region.

The light emission region and the circuit region of the each of the plurality of pixels may be arranged to be adjacent to each other.

The method may further include, between the operation of forming the plurality of first electrodes and the operation of forming the first organic layer, the operation of forming an insulating layer that covers ends of each of the plurality of first electrodes and that is interposed between the first organic layer and the ends of the each of the plurality of first electrodes.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
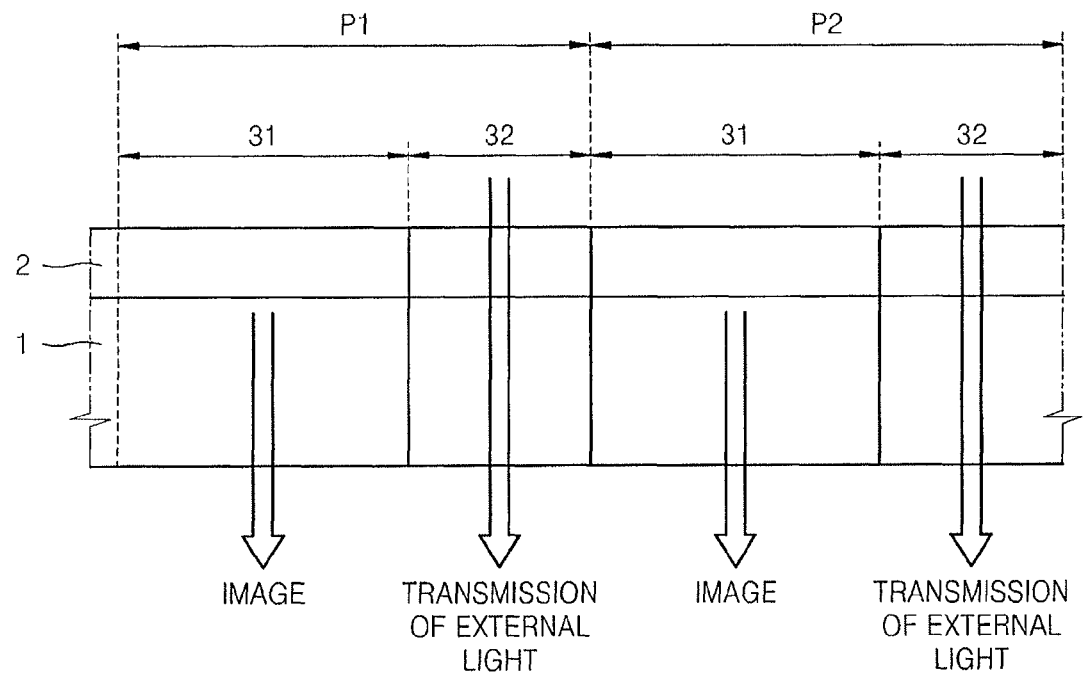
FIG. 1 illustrates a schematic cross-sectional view of adjacent first and second pixels in an organic light emitting display device according to an embodiment.

Korean Patent Application No. 10-2010-0022943, filed on Mar. 15, 2010, in the Korean Intellectual Property Office, and entitled: "Organic Light Emitting Display Device and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. As used herein, the term "and/or" includes any and all combinations of one or more of the associated listed items. Like reference numerals refer to like elements throughout.

FIG. 1 illustrates a cross-sectional view of an organic light emitting display device according to an embodiment. Referring to FIG. 1, an organic light emitting display device according to an embodiment may have a structure in which a display unit 2 may be formed on a substrate 1.

External light passes through the display unit 2 of the organic light emitting display device and the substrate 1. As will be described later, the display unit 2 may be formed to transmit the external light. That is, referring to FIG. 1, the display unit 2 may be formed so that a user facing a screen of the organic light emitting display, i.e., a surface of the display unit 2 facing away from the substrate 1 and displaying an image, may observe an object behind the substrate 1. It is noted that although FIG. 1 corresponds to a bottom emission type organic light emitting display device, i.e., a device where an image of the display unit 2 is realized toward the substrate 1, example embodiments are not limited thereto, e.g., the organic light emitting display may be a top emission type organic light emitting display device realizing the image of the display unit 2 away from the substrate 1.

FIG. 1 illustrates a first pixel P1 and a second pixel P2 that are adjacent pixels in the organic light emitting display device according to the present embodiment. Each of the first and second pixels P1 and P2 may include a first region 31 and a second region 32.

The image of the display unit 2 may be realized via the first region 31, and the external light may pass through the second region 32. That is, according to the present embodiment, each of the first and second pixels P1 and P2 may include the first region 31 for realizing the image, and the second region 32 for transmitting the external light, whereby a user may see an external image when the user does not view the image of the display unit 2. It is noted that it may be possible to significantly increase external-light transmittance by not forming devices, e.g., a thin film transistor, a capacitor, an organic light emitting device or the like, in the second region 32, and it may be possible to significantly reduce distortion, e.g., due to interference from the devices, of a transmitted-image.

Figure 2:
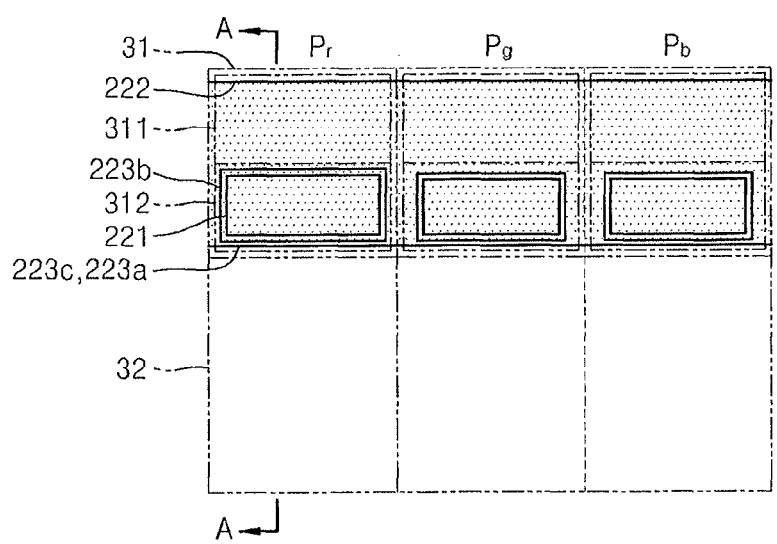
FIG. 2 illustrates a plan view of a red pixel, a green pixel, and a blue pixel that are adjacent to each other in an organic light emitting display device according to an embodiment.
Figure 3:
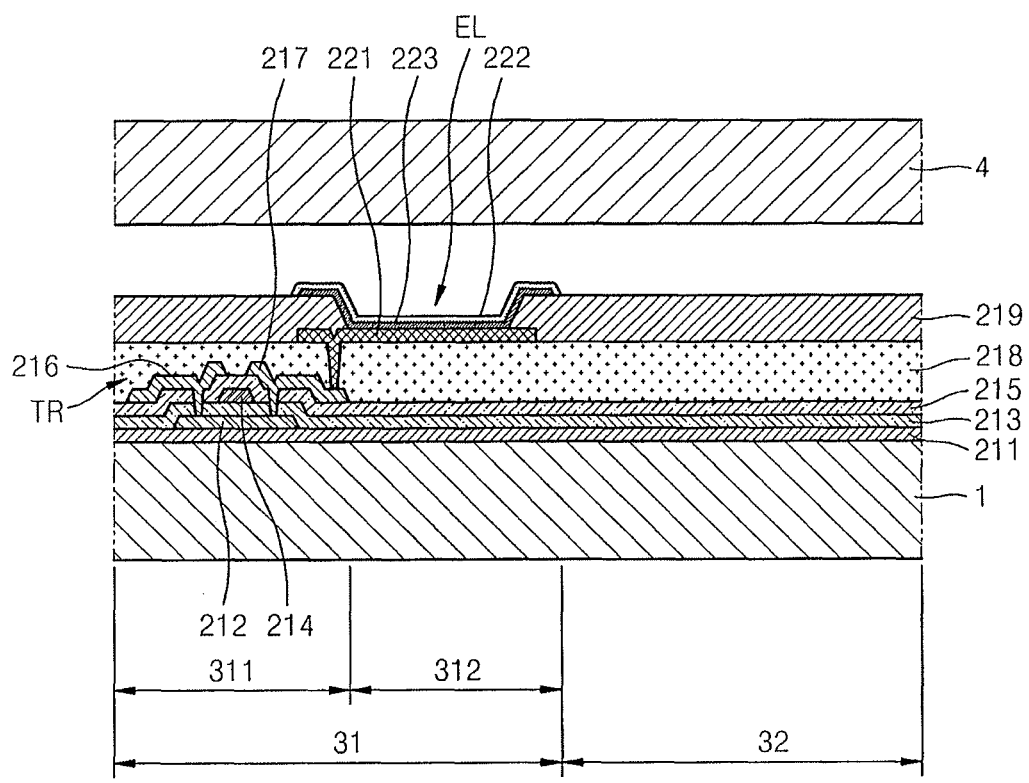
FIG. 3 illustrates a cross-sectional view of FIG. 2 along line A-A.
Figure 4:
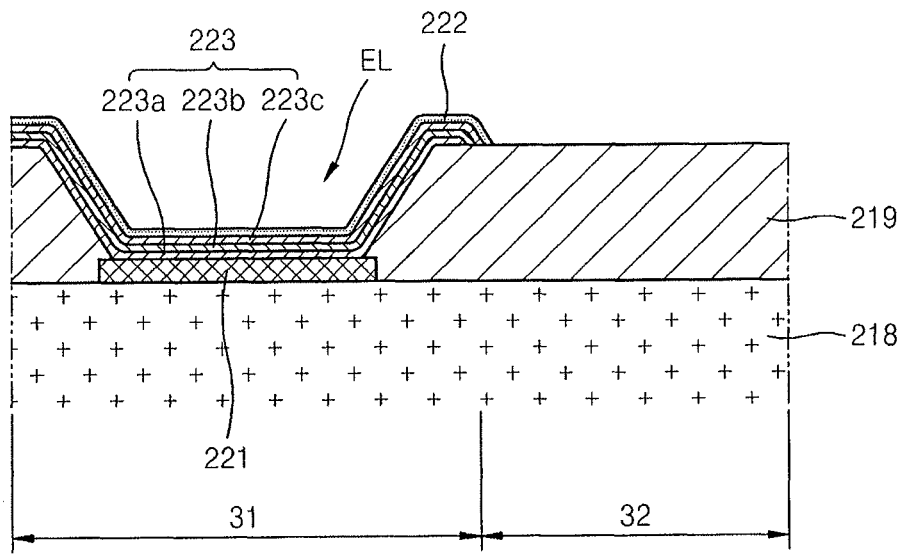
FIG. 4 illustrates a detailed cross-sectional view of the organic light emitting element in FIG. 3.

FIG. 2 illustrates a plan view of a red pixel Pr, a green pixel Pg, and a blue pixel Pb that are adjacent to each other. FIG. 3 illustrates a cross-sectional view of FIG. 2 along a line A-A. FIG. 4 illustrates a detailed, enlarged cross-sectional view of an organic light emitting element EL in FIG. 3.

As illustrated in FIG. 2, each of the red pixel Pr, the green pixel Pg, and the blue pixel Pb may include a circuit region 311 and a light emission region 312 in the first region 31. The circuit region 311 and the light emission region 312 may be arranged to be adjacent to each other. The second region 32 for transmittance of external light may be arranged to be adjacent to the first region 31.

As further illustrated in FIG. 2, the second region 32 may be separately arranged in each of the red pixel Pr, the green pixel Pg, and the blue pixel Pb. However, although not illustrated in FIG. 2, the second region 32 may be arranged extending over the red pixel Pr, the green pixel Pg, and the blue pixel Pb. In a case where the second region 32 extends over the red pixel Pr, the green pixel Pg, and the blue pixel Pb, the extension may generate an effect by which an area of the second region 32 for transmittance of external light is enlarged so that total transmittance of the display unit 2 may be increased.

As illustrated in FIG. 3, a pixel circuit unit including a thin film transistor TR may be arranged in the circuit region 311. It is noted, however, that the pixel circuit unit is not limited to a single thin film transistor TR, as illustrated in FIG. 3, but may include a plurality of thin film transistors and a storage capacitor. In addition, the pixel circuit unit may include a scan line, a data line, and a Vdd line connected to the thin film transistors and the storage capacitors.

As further illustrated in FIG. 3, an organic light emitting element EL may be arranged in the light emission region 312. The organic light emitting element EL, e.g., an organic light emitting diode, may be electrically connected to the thin film transistor TR of the pixel circuit unit.

In detail, as illustrated in FIG. 3, a buffer layer 211 may be formed on the substrate 1, and the pixel circuit unit including the thin film transistor TR may be formed on the buffer layer 211. The buffer layer 211 may be formed of a transparent insulating material, and may prevent penetration of impurity elements and planarize a surface of the substrate 1. The buffer layer 211 may be formed of any of various materials capable of performing the functions described above. For example, the buffer layer 211 may be formed of an inorganic material, e.g., one or more of silicon oxide, silicon nitride, silicon oxynitride, aluminum oxide, aluminum nitride, titanium oxide, titanium nitride, etc., an organic material, e.g., one or more of polyimide, polyester, acryl, etc., or a stack of these materials. In other implementations, the buffer layer 211 may be omitted.

Next, a semiconductor active layer 212 may be formed on the buffer layer 211. The semiconductor active layer 212 may be formed of polycrystalline silicon, but is not limited thereto, e.g., the semiconductor active layer 212 may be formed of a semiconductor oxide. For example, the semiconductor active layer 212 may be a G-I-Z-O layer [$(In_2O_3)a(Ga_2O_3)b(ZnO)c$ layer] (where a, b, and c are real numbers, satisfying a≥0, b≥0, c>0, respectively). In a case where the semiconductor active layer 212 is formed of the semiconductor oxide, light transmittance in the circuit region 311 of the first region 31 may be improved, so that external-light transmittance of the entire display unit 2 may be increased.

A gate insulating layer 213 may be formed on the buffer layer 211 so as to cover the semiconductor active layer 212, and a gate electrode 214 may be formed on the gate insulating layer 213. An interlayer insulating layer 215 may be formed on the gate insulating layer 213 so as to cover the gate electrode 214, and a source electrode 216 and a drain electrode 217 may be formed on the interlayer insulating layer 215 so as to respectively contact the semiconductor active layer 212 via a contact hole. However, the thin film transistor TR is not limited to the aforementioned structure, and thus may have any of various structures.

A passivation layer 218 may be formed to cover the thin film transistor TR. The passivation layer 218 may be a single layer or multiple layers of insulating films, upper surfaces of which are planarized, and the passivation layer 218 may be formed of an inorganic material and/or an organic material.

As further illustrated in FIG. 3, a first electrode 221 of the organic light emitting element EL that is electrically connected to the thin film transistor TR may be formed on the passivation layer 218. The first electrode 221 may have an island shape, i.e., the first electrode 221 may be formed separately in each pixel. The first electrode 221 may be formed of a material having a high work function, e.g., one or more of ITO, IZO, ZnO, or $In_2O_3$. In a case where the organic light emitting display device of FIG. 1 is a top emission type organic light emitting display device in which an image is realized away from the substrate 1, the first electrode 221 may further include a reflective layer formed of, e.g., silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca).

An insulating layer 219 may be formed on the passivation layer 218. The insulating layer 219 may cover ends of the first electrode 221, and may expose a center portion of the first electrode 221. The insulating layer 219 may cover the first region 31. In this regard it is noted that it is not necessary for the insulating layer 219 to entirely cover the first region 31, as long as the insulating layer 219 covers at least a portion of the first region 31, e.g., the insulating layer 219 may cover at least the ends, i.e., edges, of the first electrode 221. The insulating layer 219 may be formed of an organic insulating material, e.g., a polymer-based organic material including an acryl-based resin, an epoxy-based resin, polyimide or the like, and an upper surface of the insulating layer 219 may be planarized.

An organic layer 223 may be formed on the exposed center portion of the first electrode 221. The organic layer 223 may be on an entire center portion of the first electrode 221, and may extend on a portion of the insulating layer 219, which covers the ends of the first electrode 221. The organic layer 223 will be described in more detail below with reference to FIG. 4.

As illustrated in FIG. 4, the organic layer 223 may include a first organic layer 223a, a second organic layer 223b, and a third organic layer 223c. The first organic layer 223a may include a hole injection layer (HIL) and a hole transport layer (HTL). The second organic layer 223b may include an emitting layer (EML). The third organic layer 223c may include an electron injection layer (EIL) and an electron transport layer (ETL). For example, the first organic layer 223a and the third organic layer 223c may be common layers and, thus, may be commonly applied to all pixels. The second organic layer 223b, i.e., the EML, may be separately deposited in each pixel according to a color of each pixel.

The HIL may be formed of, e.g., a phthalocyanine compound including copper phthalocyanine, or TCTA, m-MTDATA, m-MTDAPB, or the like, which are a starburst-type amine. The HTL may be formed of, e.g., N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), or the like. The EIL may be formed of, e.g., lithium fluoride (LiF), sodium chloride (NaCl), cesium fluoride (CsF), lithium oxide ($Li_2O$), barium oxide (BaO), or Liq. The ETL may be formed of, e.g., aluminum tris(8-hydroxyquinoline) (Alq3).

The EML may include a host material and a dopant material. Examples of the host material may include, e.g., tris(8-hydroxy-quinolinato)aluminum (Alq3), 9,10-di(naphth-2-yl)anthracene (AND), 3-tert-butyl-9,10-di(naphth-2-yl) anthracene (TBADN), 4,4'-bis(2,2-diphenyl-ethene-1-yl)-4, 4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4''-tris(carbazol-9-yl)triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethylfluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), 9,9-bis(9-phenyl-9H-carbazol)fluorene (FL-2CBP), or the like. Examples of the dopant material may include, e.g., 4,4'-bis[4-(di-p-tolylamino)styryl]biphenyl (DPAVBi), 9,10-di(naph-2-tyl)anthracene (ADN), 3-tert-butyl-9,10-di(naph-2-tyl)anthracene (TBADN), or the like.

As illustrated in FIGS. 3 and 4, a second electrode 222 may be formed on the organic layer 223. The second electrode 222 may be formed of metal having a low work function. The second electrode 222 may include, e.g., Ag, Mg, Al, Pt, Pd, Au, Ni, Nd, Ir, Cr, Li, or Ca, in particular, a metal including Mg or a Mg alloy. The first electrode 221 may function as an anode and the second electrode 222 may function as a cathode, or polarities of the first electrode 221 and the second electrode 222 may be reversed.

As discussed previously, according to example embodiments, the first organic layer 223a and the third organic layer 223c may be deposited as common layers in all pixels, such that the first organic layer 223a and the third organic layer 223c may be commonly applied to all pixels, with the exception of at least a portion of the second region 32 in each pixel, by using a fine metal mask for patterning. For example, the first and third organic layers 223a and 223c may extend in an entire first region 31, e.g., the first and third organic layers 223a and 223c may or may not extend in a small portion of the second region 32, to overlap the first electrode 221 and a portion of the insulating layer 219. The second organic layer 223b may be patterned to correspond to each pixel, i.e., the second organic layer 223b may be patterned to correspond to, e.g., overlap only, the first electrode 221 by using another fine metal mask.

The second electrode 222 may be deposited on the third organic layer 223c and the insulating layer 219 by using metal, e.g., metal may be deposited only on the third organic layer 223c in the first region 31 and the second region 32 of each of the pixels by using an open mask when forming the second electrode 222. In detail, although the metal, e.g., Mg or Mg alloy for forming the second electrode 222, may be easily deposited to a thickness of several hundreds of Å on the third organic layer 223c, it may be difficult to deposit the metal, e.g., to a sufficient thickness, on the first organic layer 223a, the second organic layer 223b, or the insulating layer 219. Therefore, according to example embodiments, metal may be deposited only on the third organic layer 223c to form the second electrode 222 only on the third organic layer 223c, i.e., so the third organic layer 223c may be between the insulating layer 219 and the second electrode 222.

In detail, as illustrated in FIGS. 3 and 4, the third organic layer 223c may be formed on a region in which the second electrode 222 is to be formed, e.g., the organic layer 223 including the third organic layer 223c may not formed in a portion of the second region 32 in which the second electrode 222 is not to be formed. By doing so, when the metal, e.g., Mg or Mg alloy, is deposited on the third organic layer 223c to form the second electrode 222, although the metal is deposited on the first region 31 and the second region 32 of each of the pixels by using the open mask, the metal may be deposited only on the third organic layer 223c and may not be deposited on an exposed surface of the insulating layer 219. Therefore, a patterning effect of the second electrode 222 may be automatically obtained. As such, plasma-treatment of a surface of the insulating layer for facilitating deposition of metal on the insulating layer may be eliminated.

In addition, automatically obtaining the patterning effect of the second electrode 222 according to example embodiments may improve uniformity and stability of the second electrode 222 when using a fine metal mask, i.e., as opposed to an open mask, to form a patterned second electrode 222. In particular, since a deposition temperature of metal is significantly high, the fine metal mask may be deformed when used for a long time period, thereby triggering occurrence of a shadow phenomenon and unstable factors in a procedure. However, as the present embodiment may automatically obtain the patterning effect on the second electrode 222, excellent environment for manufacturing an organic light emitting display device may be provided.

Also, since the second electrode 222 is deposited only on the third organic layer 223c and is not deposited on a large portion of the second region 32, external light transmittance through the second region 32 may be significantly increased.

Figure 5:
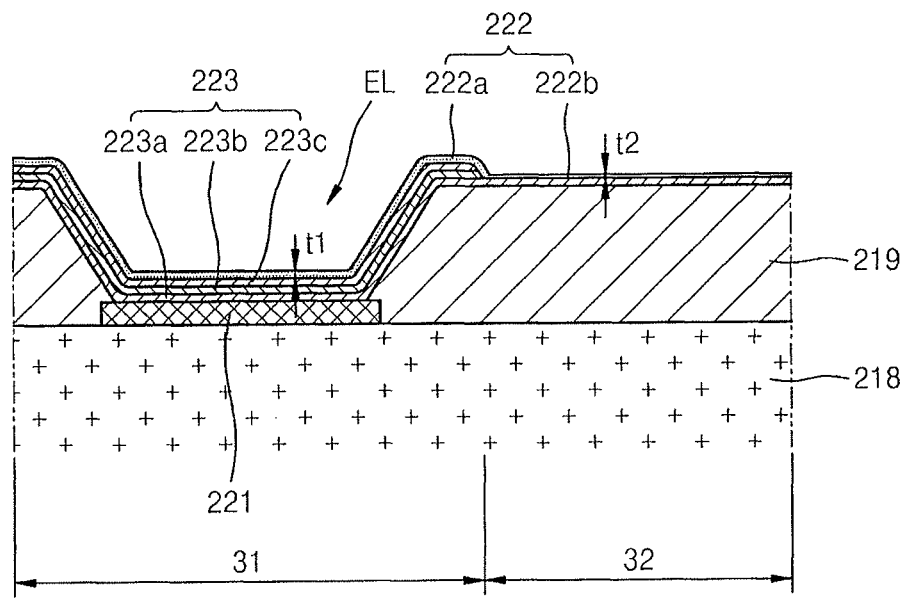
FIG. 5 illustrates a cross-sectional view of an organic light emitting device unit according to another example.

FIG. 5 illustrates a cross-sectional view of an organic light emitting device unit according to another exemplary embodiment. As illustrated in FIG. 5, the first organic layer 223a may be deposited as a common layer, and may extend in the first and second regions 31 and 32. The second organic layer 223b may be separately deposited for each pixel. As further illustrated in FIG. 5, the third organic layer 223c may be formed in the first region 31, e.g., the third organic layer 223c may not be formed in the second region 32. Here, the third organic layer 223c may be commonly deposited, e.g., formed simultaneously, in all the pixels.

As illustrated in FIG. 5, the second electrode 222 may be formed on the organic layer 223, and may include a first portion 222a and a second portion 222b. The first portion 222a of the second electrode 222 may have a first thickness t1, and may be formed on, e.g., directly on, the third organic layer 223c in the first region 31. The second portion 222b of the second electrode 222 may have a second thickness t2, and may be formed on, e.g., directly on, the first organic layer 223a in the second region 32. Since the second thickness t2 is smaller than the first thickness t1, transmittance deterioration due to the second portion 222b may be reduced. It is noted that, as in the embodiment of FIG. 5, the embodiment described previously with reference to FIG. 4 may have the second electrode 222 with a smaller thickness on the insulating layer 219 in the second region 32.

Figure 6:
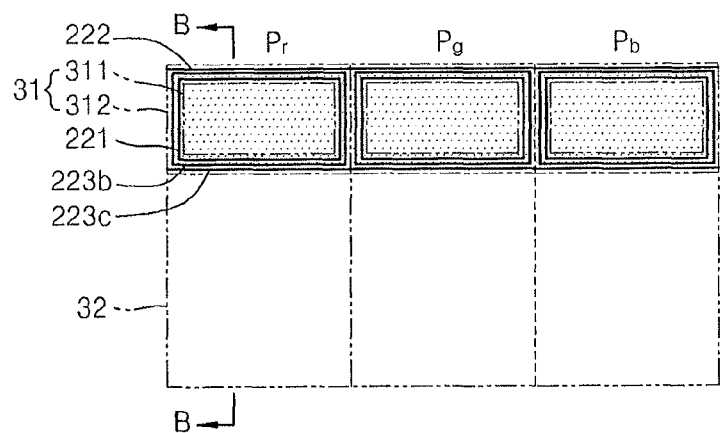
FIG. 6 illustrates a plan view of a red pixel, a green pixel, and a blue pixel that are adjacent to each other in an organic light emitting display device according to another embodiment.

It is noted that embodiments apply not only to a structure in which the pixel circuit unit including the thin film transistor TR is horizontally spaced apart from the first electrode 221, as illustrated in FIG. 2. For example, embodiments may apply to a structure in which the circuit region 311 including the pixel circuit unit with the thin film transistor TR is overlapped with the first electrode 221, as illustrated in FIGS. 6 and 7.

Figure 7:
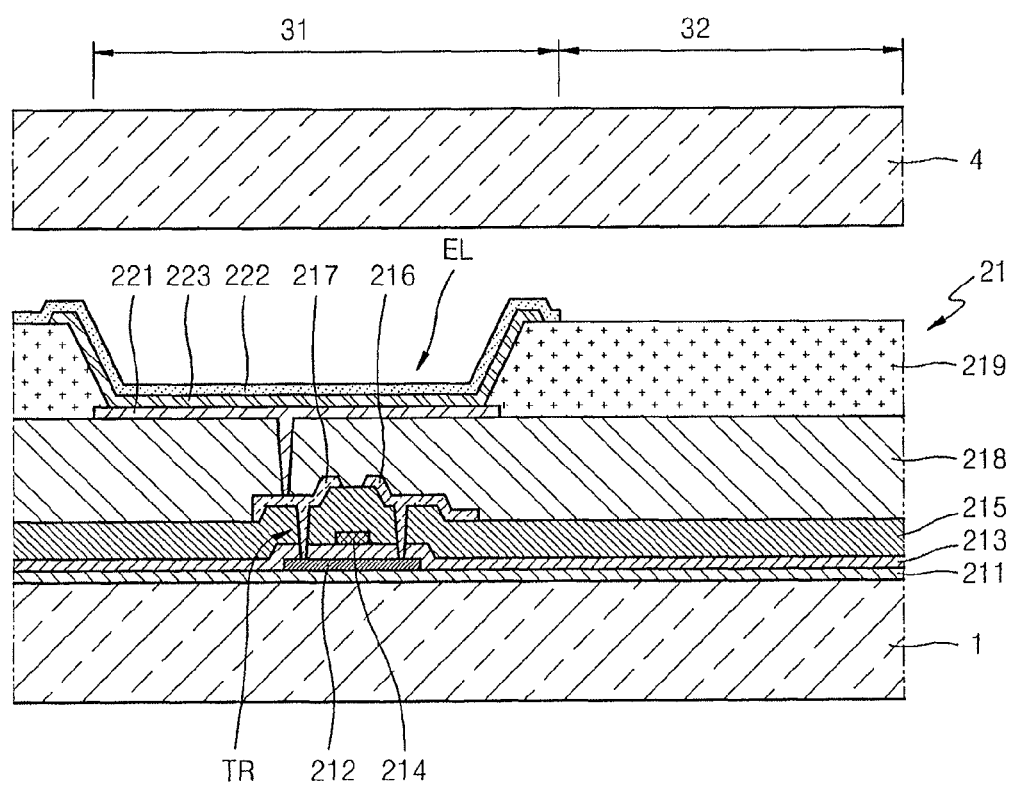
FIG. 7 illustrates a cross-sectional view of FIG. 6 along line B-B.

Referring to FIG. 7, if the first electrode 221 is formed as a reflective electrode, a conductive pattern of the pixel circuit unit may be covered by the first electrode 221. Therefore, it may be possible to reduce distortion of a transmitted image, e.g., distortion due to scattering of external light by the conductive pattern of the pixel circuit unit.

As described above, according to example embodiments, it may be possible to significantly reduce transmittance deterioration in a second region, i.e., a region for transmitting external light, so that a user may easily observe an external image. Also, a patterning effect on the second electrode may be automatically obtained, so that it may be possible to provide an excellent environment for manufacturing an organic light emitting display device.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display device, comprising:
   a substrate;
   a plurality of pixels on the substrate, each pixel having a first region configured to emit light and a second region configured to transmit external light;
   a plurality of pixel circuit units, each pixel circuit unit being in the first region of each of the plurality of pixels and including at least one thin film transistor;
   a plurality of first electrodes, each first electrode being in the first region of each of the plurality of pixels and being electrically connected to a respective pixel circuit unit, the first electrode having an island shape corresponding to a respective pixel of the plurality of pixels;
   a first organic layer covering the plurality of first electrodes;
   a second organic layer on the first organic layer, the second organic layer including an emission layer;
   a third organic layer on the second organic layer, the third organic layer being positioned in the first region and outside a central portion of the second region; and
   a second electrode having a first portion only on the third organic layer.

2. The organic light emitting display device as claimed in claim 1, wherein the first organic layer includes at least one of a hole transport layer and a hole injection layer, and the third organic layer includes at least one of an electron transport layer and an electron injection layer.

3. The organic light emitting display device as claimed in claim 1, wherein the third organic layer is only in the first region, the second electrode being only and directly on the third organic layer.

4. The organic light emitting display device as claimed in claim 1, wherein the first organic layer is only in the first region, the third organic layer completely overlapping the first organic layer.

5. The organic light emitting display device as claimed in claim 1, wherein the first organic layer is in the first region and the second region, the first organic layer extending beyond the third organic layer.

6. The organic light emitting display device as claimed in claim 5, wherein the second electrode further comprises a second portion on the first organic layer in the second region, the first and second portions of the second electrode being connected to each other.

7. The organic light emitting display device as claimed in claim 6, wherein a thickness of the second portion is smaller than a thickness of the first portion.

8. The organic light emitting display device as claimed in claim 1, wherein the plurality of pixel circuit units overlaps the plurality of first electrodes, respectively.

9. The organic light emitting display device as claimed in claim 1, wherein the first region of each of the plurality of pixels includes a light emission region and a circuit region, each of the plurality of pixel circuit units being in the circuit region, and each of the plurality of first electrodes being in the light emission region.

10. The organic light emitting display device as claimed in claim 9, wherein the light emission region and the circuit region of the each of the plurality of pixels are adjacent to each other.

11. The organic light emitting display device as claimed in claim 1, further comprising an insulating layer covering ends of each of the plurality of first electrodes, the third organic layer separating the second electrode from the insulating layer.

12. The organic light emitting display device as claimed in claim 1, wherein the second electrode includes magnesium (Mg).

* * * * *